United States Patent [19]
Hiraki et al.

[11] Patent Number: 5,835,979
[45] Date of Patent: Nov. 10, 1998

[54] WIRING PATTERN PREVENTING EMI RADIATION

[75] Inventors: Motozane Hiraki; Makoto Mukai; Shinichi Ohtsu; Masaki Ogawa, all of Kawasaki, Japan

[73] Assignee: Fujitsu Limited, Kawasaki, Japan

[21] Appl. No.: 864,697

[22] Filed: May 28, 1997

Related U.S. Application Data

[63] Continuation of Ser. No. 415,462, Apr. 3, 1995, abandoned.

[30] Foreign Application Priority Data

Jun. 2, 1994 [JP] Japan .................................. 6-121196

[51] Int. Cl.⁶ .................................................. H01B 11/06
[52] U.S. Cl. ................................ 174/33; 174/36; 361/772
[58] Field of Search ......................... 174/33, 36; 361/772, 361/765

[56] References Cited

U.S. PATENT DOCUMENTS

| | | | |
|---|---|---|---|
| 3,757,028 | 9/1973 | Schlessel | 174/33 |
| 4,868,634 | 9/1989 | Ishida et al. | 361/772 |
| 5,036,160 | 7/1991 | Jackson | 174/33 |
| 5,039,824 | 8/1991 | Takashima | 174/33 |
| 5,298,680 | 3/1994 | Kenny | 174/36 |
| 5,424,490 | 6/1995 | Dombrowski et al. | 174/33 |

FOREIGN PATENT DOCUMENTS

| | | | |
|---|---|---|---|
| 5-174640 | 7/1993 | Japan | 174/33 |

*Primary Examiner*—Kristine L. Kincaid
*Assistant Examiner*—Marc D. Machtinger
*Attorney, Agent, or Firm*—Nikaido, Marmelstein, Murray & Oram LLP

[57] ABSTRACT

A wiring pattern includes first halves, each of which is a first half of a corresponding one of one or more intervals into which the wiring pattern is divided, and second halves, each of which is a second half of a corresponding one of the one or more intervals, wherein an electromagnetic field generated by the first half is canceled by an electromagnetic field generated by the second half.

3 Claims, 9 Drawing Sheets

F I G. 4
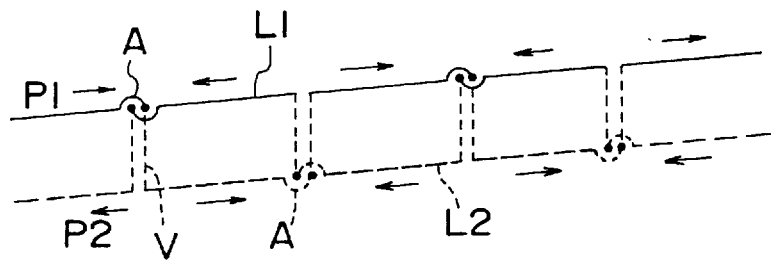
F I G. 5
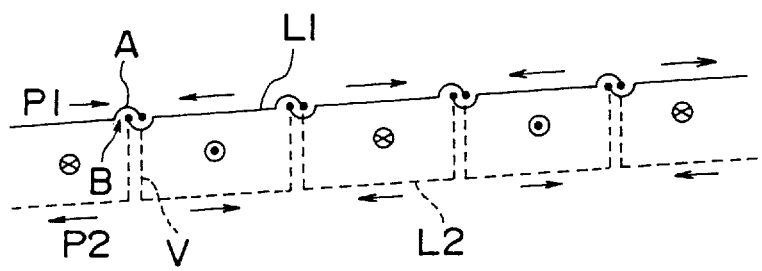
F I G. 6
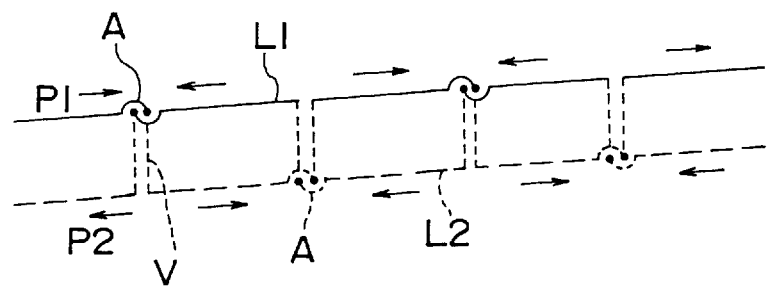

WIRING PATTERN PREVENTING EMI RADIATION

This application is a continuation of application Ser. No. 08/415,462 filed Apr. 3, 1995, now abandoned.

BACKGROUND OF THE INVENTION

1. Field of the Invention

The present invention generally relates to a wiring pattern on a printed wiring board, and more particularly relates to a wiring pattern which can suppress EMI (electromagnetic interference) radiation.

In many countries, there are regulations for preventing interference of receptions of television and radio signals. Organizations producing regulation standards include VCCI of Japan, FCC of the United States, and VDE of Germany, to just name a few.

As measures for preventing the reception interference, various technologies related to shielding and filtering are used in combination. In devices pursuing a higher performance and a further miniaturization, however, taking such measures without compromising the pursuit are becoming increasingly difficult. Especially in portable personal computers having a high-speed CPU inside, adding special components for shielding or filtering creates concerns of a weight increase and of a possible detrimental effect on signals running inside. Thus, a better solution has to be provided.

2. Description of the Prior Art

In order to suppress EMI radiation generated by a wiring pattern on a printed wiring board, the prior art technique uses such methods as a) shortening lengths of the wiring pattern; b) thinning the board; c) assuring terminal matching; d) inserting dumping resistance; and e) inserting EMI filters. Here, the methods a) and b) are intended to reduce sizes of wiring patterns and electric current loops formed in a circuit since larger patterns and loops tend to generate larger EMI radiations. The method d) is intended to reduce magnitudes of electric currents running on wiring patterns since larger electric currents generate a greater EMI radiation.

As for the method a), various requirements in designing the wiring pattern pose a limitation on an extent to which the lengths of the wiring pattern is shortened. In practice, thus, the method a) is not appropriate. As for the method b), a requirement for a satisfactory strength of the board puts a limit on the thinness of the board. The methods c) through e) require an addition of components, which is not a solution by a printed wiring technology itself. Also, as noted above, there are concerns for a weight increase and for a possible detrimental effect on signals, so that these methods are certainly not appropriate solutions.

Accordingly, there is a need in the field of printed wiring patterns for a wiring pattern which can suppress the EMI radiation without losing a scope for a design and without changing a shape of the board, and which can provide a fundamental solution.

SUMMARY OF THE INVENTION

Accordingly, it is a general object of the present invention to provide a wiring pattern which can satisfy the need described above.

It is another and more specific object of the present invention to provide a wiring pattern which can suppress EMI radiation without losing a scope for a design and without changing a shape of a board.

In order to achieve the above objects, a wiring pattern according to the present invention includes first halves, each of which is a first half of a corresponding one of one or more intervals into which the wiring pattern is divided, and second halves, each of which is a second half of a corresponding one of the one or more intervals, wherein an electromagnetic field generated by the first half is canceled by an electromagnetic field generated by the second half.

According to the present invention, a signal line is divided into n intervals ($n \geq 1$), each of which is further divided into two halves. Thus, electromagnetic fields generated by electric current on the signal line can be canceled by each other between a pair of the two halves. This does not obstruct a scope for the design of the wiring pattern, yet can suppress the EMI radiation on its own.

Other objects and further features of the present invention will be apparent from the following detailed description when read in conjunction with the accompanying drawings.

BRIEF DESCRIPTION OF THE DRAWINGS

FIG. 4 is an illustrative drawing showing a variation of the first embodiment;

FIG. 5 is an illustrative drawing showing a second embodiment of the present invention;

FIG. 6 is an illustrative drawing showing a variation of the second embodiment;

DESCRIPTION OF THE PREFERRED EMBODIMENTS

In the following, principles and embodiments of the present invention will be described with reference to the accompanying drawings.

Figure 1:
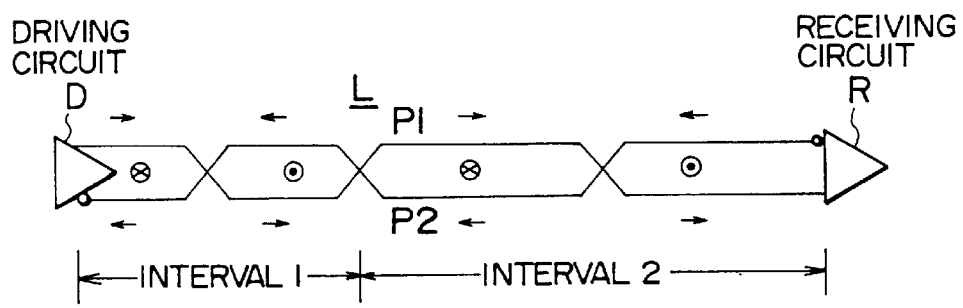
FIG. 1 is an illustrative drawing showing a principle of the present invention.

FIG. 1 shows a principle of the present invention. In FIG. 1, a driving circuit D is connected with a receiving circuit R via a forward line P1 and a backward line P2. The forward line P1 and the backward line P2 form a signal line L. As shown in FIG. 1, the signal line L is divided into a plurality of intervals (intervals 1 and 2 in this example), each of which is further divided into two. Electric current on each line segment, whose directions are indicated by arrows, generates magnetic fields in directions shown in FIG. 1. Here, the symbol ⊗ indicates a downward direction normal to a sheet surface of FIG. 1, and the symbol "⊙" indicates an upward direction normal to the sheet surface.

In order to suppress EMI radiation, the principle of the present invention divides the signal line L into n intervals (n≧1), each of which is further divided into halves. Thus, electromagnetic fields generated by the electric current on the signal line are canceled by each other between a pair of halves of the intervals.

The interval may be made small relative to a wavelength of a signal frequency on the signal line so that the EMI radiation can be suppressed more effectively.

In the following, first through fourth embodiments will be described with reference to FIG. 3 through FIG. 10. In FIG. 3 through FIG. 10, the present invention is applied to a two-layer printed wiring board.

Figure 2:
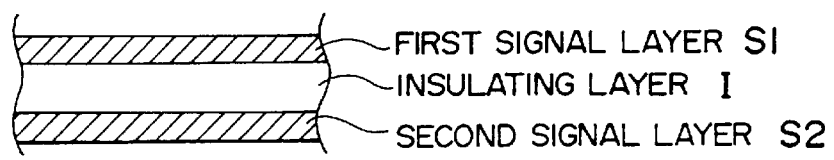
FIG. 2 is an illustrative drawing showing a structure of a two-layered printed wiring board.

FIG. 2 shows the two-layer printed wiring board. As shown in FIG. 2, a first signal layer S1 and a second signal layer S2 are provided on both sides of an insulating layer I. A wiring pattern is formed on each of the first signal layer S1 and the second signal layer S2. When necessary, vias formed through the insulating layer I connect the wiring pattern on the first signal layer S1 with the wiring pattern on the second signal layer S2.

In FIG. 3 through FIG. 10, a wiring pattern shown by a solid line is formed on one of the signal layers of the two-layer printed wiring board. A side of this layer is called a front side hereinafter. A wiring pattern shown by a dotted line is formed on the other one of the signal layers. A side of this layer is referred as a back side hereinafter. Arrows in the figures show directions in which electric current of signals flow. The symbols ⊗ and "⊙" show directions of magnetic fields. P1 denotes a forward line, and P2 a backward line. Vias are denoted by V.

Figure 3:
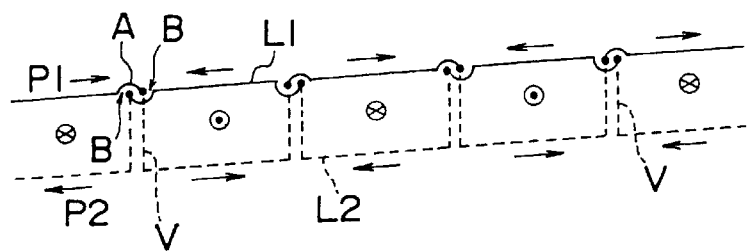
FIG. 3 is an illustrative drawing showing a first embodiment of the present invention.

FIG. 3 shows the first embodiment of the present invention. In the first embodiment, a signal line is divided into n intervals (n≧1), each of which is further divided into halves in the same manner as in FIG. 1. Divided wiring patterns L1 and L2 are formed on the front side and the back side, respectively, of the two-layer printed wiring board.

A segment of the divided wiring pattern L1 formed on the front side has arc portions A at both ends thereof. Openings B of arc portions A are presented in the same direction for the same segment. The openings B of adjacent segments face each other. Vias V are formed at ends of the arc portions A, so that the ends of the arc portions A are connected to the wiring pattern L2 on the back side. Signal currents P1 and P2 flow in directions shown by arrows.

Magnetic fields generated by the signal currents are directed in opposite directions between a pair of halves of the intervals, as shown in FIG. 3. Since magnitudes of the magnetic fields become equal between a pair of the halves, the magnetic fields are canceled by each other. Thus, the EMI radiation can be suppressed.

FIG. 4 shows a variation of the first embodiment. One segment on the front side has the two arc portions A at both ends thereof in FIG. 3. On the contrary, a segment of the divided wiring pattern L1 on the front side has one arc portion A at one end thereof. Also, a segment of the divided wiring pattern L2 on the back side has one arc portion A at one end thereof. The arc portions A of segments on the front side are arranged such that the openings B of adjacent segments face each other. The same arrangement is applied to the segments on the back side. The arc portions A on the front side and the arc portions A on the back side are staggered. The divided wiring patterns L1 and L2 are connected with each other through vias V.

FIG. 5 shows the second embodiment of the present invention. The second embodiment differs from the first embodiment only in that the arc portions A at both ends of a segment of the divided wiring pattern L1 have the openings B presented in different directions.

The same as in the first embodiment, magnetic fields generated by the signal currents P1 and P2 are canceled by each other in the second embodiment. Thus, the EMI radiation can be suppressed.

FIG. 6 shows a variation of the second embodiment. As shown in FIG. 6, segments of the divided wiring pattern L1 have the arc portion A at one end thereof. Situated at staggered positions with the arc portions A on the front side, other arc portions A are formed at an end of segments on the back side. The wiring pattern L1 on the front side and the wiring pattern L2 on the back side are connected with each other through the vias V.

Figure 7:
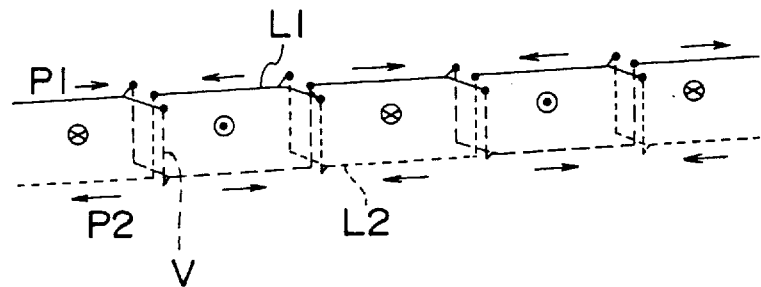
FIG. 7 is an illustrative drawing showing a third embodiment of the present invention.

FIG. 7 shows the third embodiment of the present invention. In this embodiment, the wiring pattern L1 and the wiring pattern L2 are divided in the same manner as in the previous embodiments. Each segment of the wiring pattern L1 on the front side has a Y-shaped end, and the via V is formed at each of two ends of the Y shape. In the same manner, each segment of the wiring pattern L2 on the back side has a Y-shaped end, which is connected with the Y-shaped end of the wiring pattern L1 on the front side through the vias V. An end opposite the Y-shaped end of each segment on the front side is connected to a via V situated at a general center between the two ends of the Y shape of an adjacent segment. Each segment on the back side is arranged in the same manner. The ends opposite the Y-shaped ends are connected through vias between the front side and the back side.

In the third embodiment, magnetic fields generated by the signal currents P1 and P2 are canceled by each other as in the previous embodiments. Thus, the EMI radiation can be suppressed.

Figure 8:
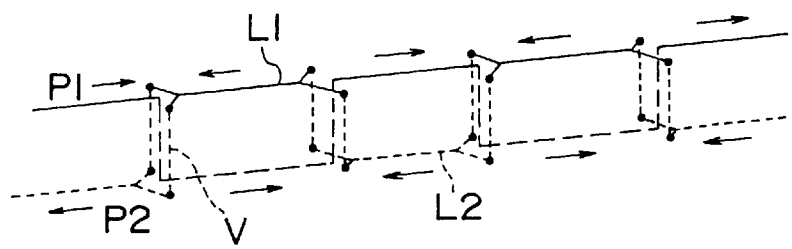
FIG. 8 is an illustrative drawing showing a variation of the third embodiment.

FIG. 8 shows a variation of the third embodiment. In the variation of third embodiment, every other segment on the front side has the Y shapes at both ends thereof. The same arrangement is applied to the back side. The segments having the Y-shaped ends are staggered between the front side and the back side. The segments on the front side are connected with the segments on the back side through the vias V.

Figure 9:
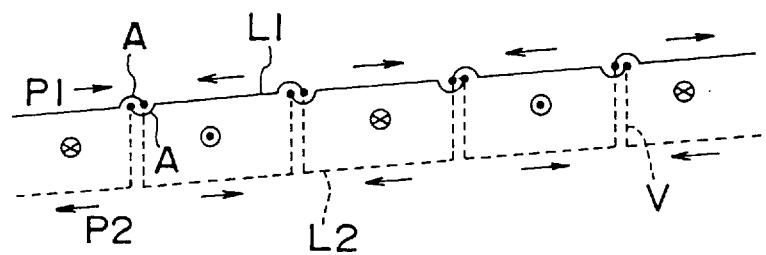
FIG. 9 is an illustrative drawing showing a fourth embodiment of the present invention.

FIG. 9 shows the fourth embodiment of the present invention. The fourth embodiment is a combination of the first embodiment and the second embodiment. That is, every other segment on the front side is identical to the segments of the first embodiment, and segments identical to the segments of the second embodiment are placed between them. In the fourth embodiment, magnetic fields generated by the signal currents P1 and P2 are canceled by each other as in the previous embodiments. Thus, the EMI radiation can be suppressed.

Figure 10:
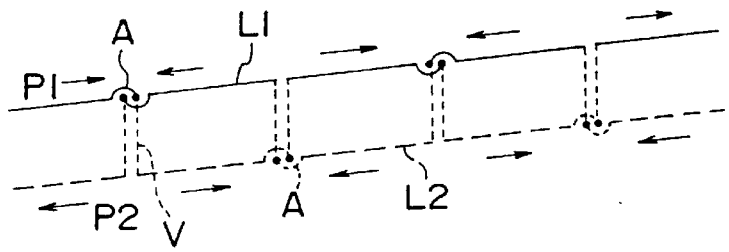
FIG. 10 is an illustrative drawing showing a variation of the fourth embodiment.

FIG. 10 shows a variation of the fourth embodiment. In the fourth embodiments, the arc portions are provided on the front side and the back side of the two-layer printed wiring board, and are staggered between the two sides. The wiring pattern L1 on the front side is connected with the wiring pattern L2 on the back side through the vias V.

Here, the variation of the fourth embodiment and the variation of the second embodiment (shown in FIG. 4) are different in that the forward line and the backward line are intertwined in the fourth embodiment.

The present invention is not limited to the configurations shown in FIG. 3 through FIG. 10, and any combination of the wiring patterns shown in those figures can be used in the present invention. For example, the wiring pattern of the third embodiment in FIG. 7 can be combined with the wiring pattern of the first embodiment, and/or the wiring pattern of the second embodiment.

Figure 11:
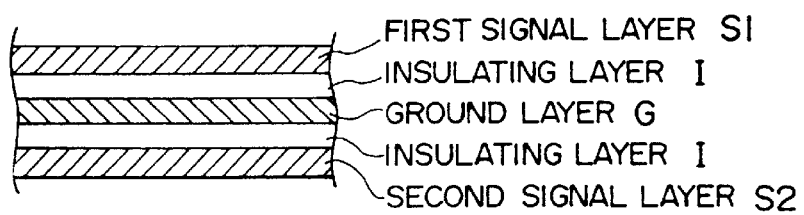
FIG. 11 is an illustrative drawing showing a structure of three-layer printed wiring board.

A fifth embodiment concerns a three-layer printed wiring board. FIG. 11 shows an illustrative drawing for explaining a structure of the three-layer printed wiring board.

As shown in FIG. 11, the three-layer printed wiring board has two insulating layers I provided on both sides of a ground layer G. Further, a first signal layer S1 and a second signal layer S2 are provided on outer sides of the two insulating layers. Wiring patterns are formed on the first and second signal layers S1 and S2, and are connected with each other, if necessary, through vias. Electric currents flow in the same direction on the first and second signal layers S1 and S2, and the ground layer G is used as a return path for signals.

Figure 12A:
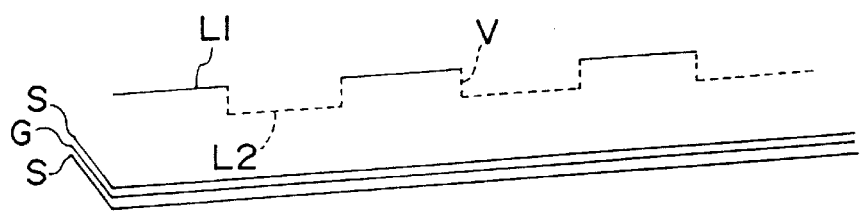
FIGS. 12A and 12B are an isometric view of a wiring pattern on the three-layer printed wiring board, and a side view of the wiring pattern, respectively, according to the fifth embodiment of the present invention.
Figure 12B:
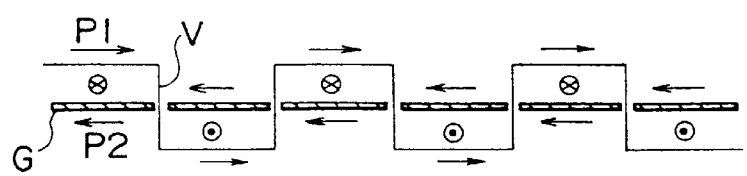

FIGS. 12A and 12B show an isometric view of a wiring pattern on the three-layer printed wiring board, and a side view of the wiring pattern, respectively, according to the fifth embodiment of the present invention.

In FIG. 12A, a wiring pattern shown by a solid line is formed on one of the signal layers of the three-layer printed wiring board. A side of this layer is called a front side hereinafter. A wiring pattern shown by dotted line is formed on the other one of the signal layers. A side of this layer is referred as a back side hereinafter. Arrows in the figures show directions in which an electric current flows. The symbols $\otimes$ and "$\odot$" show directions of magnetic fields. P1 denotes a forward line, and P2 a backward line. Vias are denoted by V.

In the fifth embodiment, a signal line is divided into n intervals (n≧1), each of which is further divided into halves in the same manner as in FIG. 1. Divided wiring patterns L1 and L2 are formed on the front side and the back side, respectively, of the three-layer printed wiring board, as shown in FIG. 12A.

With reference to FIGS. 12A and 12B, the wiring pattern L1 on the front side is connected with the wiring pattern L2 on the back side through vias V. A signal current flows in a forward direction P1 on the wiring pattern L1, and flows in a backward direction (returning direction) P2 on the ground layer G.

As a result, directions of magnetic fields generated by the electric current become opposite to each other between a pair of halves of the intervals. Since magnitudes of the magnetic fields are equal between a pair of the halves, the magnetic fields are canceled by each other. Thus, the EMI radiation can be suppressed.

Figure 13A:
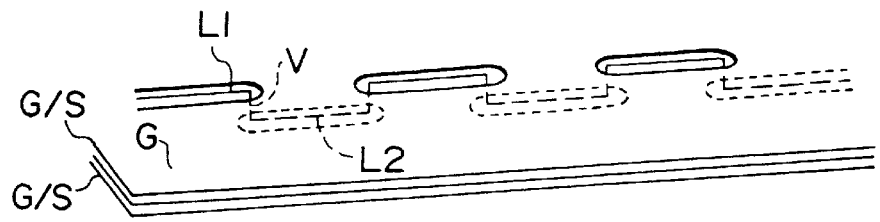
FIGS. 13A through 13C are illustrative drawings showing a sixth embodiment of the present invention.
Figure 13B:
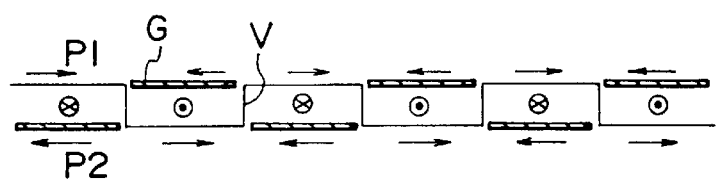
Figure 13C:
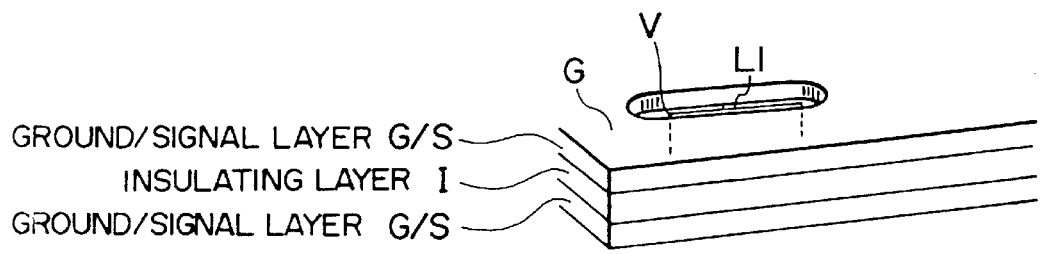

FIGS. 13A through 13C show a sixth embodiment of the present invention. In FIGS. 13A through 13C, the present invention is applied to a two-layer printed wiring board comprised of two signal/ground layers, each of which serves as both a ground layer and a signal layer at the same time. The sixth embodiment of the present invention can also be applied to a printed wiring board having more than two layers which is comprised of a plurality of the two-layer printed wiring boards piled one over another.

FIG. 13A shows an isometric view of a wiring pattern on the two-layer printed wiring board. FIG. 13B shows a side view of the wiring pattern. FIG. 13C is an illustrative drawing showing a structure of the two-layer printed wiring board and a relation between the wiring patterns and the ground.

As shown in FIG. 13C, the two-layer printed wiring board of the sixth embodiment has two conductive layers on both sides of an insulating layer I. A wiring pattern L1 can be provided in an elongated hole formed through the conductive layer. The wiring pattern L1 can be connected through vias V to the wiring pattern L2 on the back side. Each of the conductive layers is called a ground/signal layer G/S, and is used as a returning path for signals.

In FIG. 13A, the wiring pattern L1 shown by solid lines is formed on the front side of the two-layer printed wiring board. The wiring pattern L2 shown by dotted lines is formed on the back side thereof in the same manner as shown in FIG. 13C, i.e. by forming elongated holes through the ground/signal layer.

Arrows in the figures show directions in which an electric current flows. The symbols $\otimes$ and "$\odot$" show directions of magnetic fields. P1 denotes a forward line, and P2 a backward line. Vias are denoted by V.

In the sixth embodiment, a signal line is divided into n intervals (n≧1), each of which is further divided into halves in the same manner as in FIG. 1. Divided wiring patterns L1 and L2 are formed on the front side and the back side, respectively, of the two-layer printed wiring board, as shown in FIG. 13A.

With reference to FIGS. 13A and 13B, the wiring pattern L1 on the front side is connected with the wiring pattern L2 on the back side through the vias V. A signal current flows in a forward direction P1 on the wiring pattern L1 and the wiring pattern L2, and flows in a backward direction (returning direction) P2 on the ground/signal layers G/S.

As a result, directions of magnetic fields generated by the electric current become opposite to each other between a pair of halves of the intervals. Thus, the EMI radiation can be suppressed in the same manner as in the previous embodiments.

Figure 14:
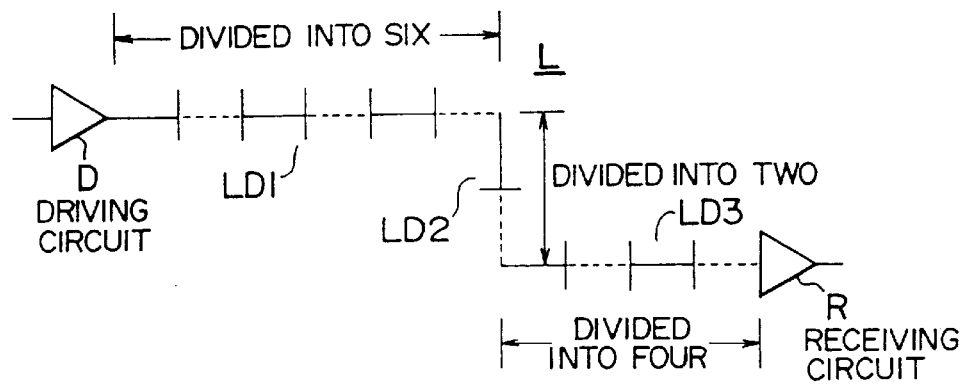
FIG. 14 is an illustrative drawing showing a seventh embodiment of the present invention.

FIG. 14 shows a seventh embodiment of the present invention. In the figure, a driving circuit D is connected with a receiving circuit R through a signal line L.

In the seventh embodiment, the signal line L is divided into three lines LD1, LD2, and LD3. Each of the lines LD1, LD2, and LD3 is further equally divided into an even number of intervals. Segments of lines corresponding to these intervals are arranged in any one of the configurations described in the previous embodiments.

For example, when the circuit of FIG. 14 is implemented on the two-layer printed wiring board, a forward line of the circuit is comprised of every other segment formed on the front side and remaining intermittent segments on the back side, while a backward line is arranged in the same way but staggered with the forward line.

Although each interval is divided into two to make a pair of halves in the previous embodiments, each segment which belongs to the same line has an equal length in the seventh embodiment. In this configuration, magnetic fields are also canceled by each other, which results in suppression of the EMI radiation. As shown in this embodiment, the present invention is effective in suppressing the EMI radiation even for a wiring pattern comprised of plurality of lines connected at an angle.

Figure 15:
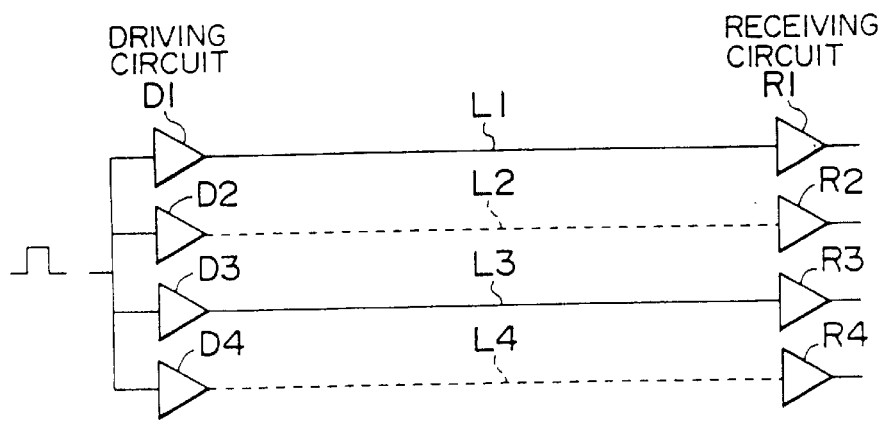
FIG. 15 is an illustrative drawing showing an eighth embodiment of the present invention.

FIG. 15 shows an eighth embodiment of the present invention. In this embodiment, the present invention is applied to a wiring pattern comprised of a plurality of parallel lines such as a data bus, on which lines a plurality of signals change in synchronism with each other.

In FIG. 15, driving circuit D1 through D4 are connected with receiving circuits R1 through R4 via signal lines L1 through L4, respectively. Signal currents in synchronism with each other flow on the signal line L1 through L4.

When the signal lines of FIG. 15 are implemented on the three-layer printed wiring board having the two signal layers on both sides of the ground layer, the signal lines L1 and L3 are arranged on the signal layer of the front side, and the signal lines L2 and L4 are arranged on the signal layer of the back side.

In this arrangement, magnetic fields generated by the signal lines L1 and L3 are canceled by those generated by the signal lines L2 and L4. Thus, the EMI radiation can be suppressed.

When signals on the signal line L1 and L3 are in a reverse phase with signals on the signal line L2 and L3, all these signal lines may be implemented on the same side of the printed wiring board.

FIGS. 16A and 16B through 19A and 19B show magnitudes of electromagnetic fields generated by wiring boards. These magnitudes are results of electromagnetic field simulations emulating the conditions of the VCCI standard (measurement distance: 10 m, height of antenna: 1 to 4 m, frequency spectrum: vertical polarization).

Figure 16A:
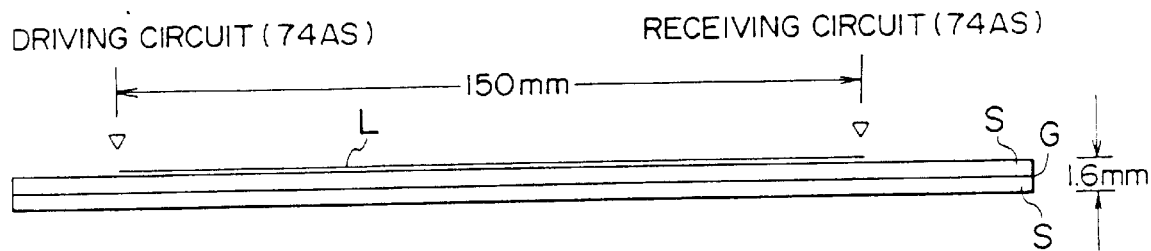
FIGS. 16A and 16B are, respectively, an illustrative drawing showing an arrangement for an electromagnetic-field simulation, and a graph showing a magnitude of EMI radiation.

FIG. 16A shows a configuration of a circuit and a printed wiring board with which an electromagnetic field simulation is conducted. Here, signal lines are arranged according to the prior art. Specifications of the circuit and the printed wiring board are as follows.

| PRINTED WIRING BOARD: | |
|---|---|
| LAYER STRUCTURE | THREE LAYERS (SIGNAL/GROUND/SIGNAL) |
| BOARD THICKNESS | 16 mm |
| PERMITTIVITY | 4.7 |
| CHARACTERISTIC IMPEDANCE | 92 Ω |
| DRIVING CIRCUIT: | TTL 74AS SERIES |
| RECEIVING CIRCUIT: | TTL 74AS SERIES |
| SIGNAL LINE LENGTH: | 150 mm |

Figure 16B:
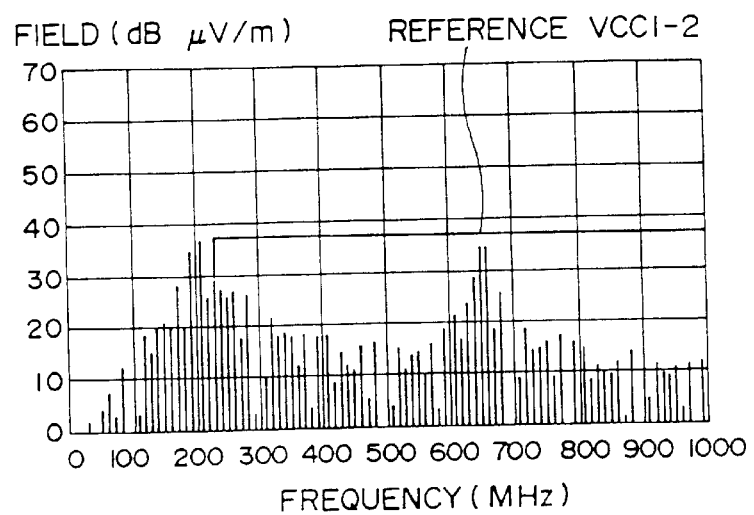

FIG. 16B is a graph showing the magnitude of the EMI radiation generated by the configuration of FIG. 16A. Here, "Reference VCCI-2" in the figure indicates a tolerable range set forth in the VCCI standard.

Figure 17A:
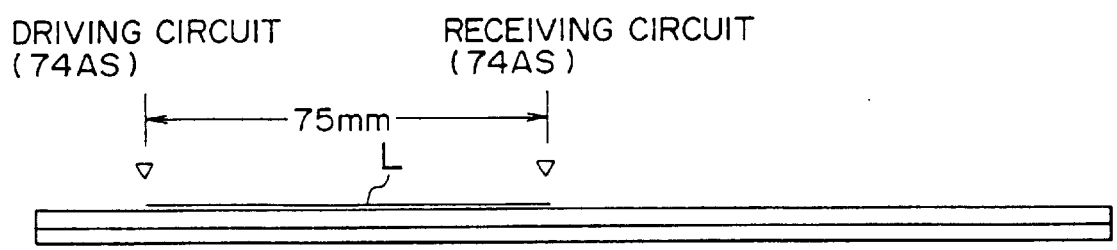
FIGS. 17A and 17B are, respectively, an illustrative drawing showing an arrangement for an electromagnetic-field simulation, and a graph showing a magnitude of EMI radiation.
Figure 17B:
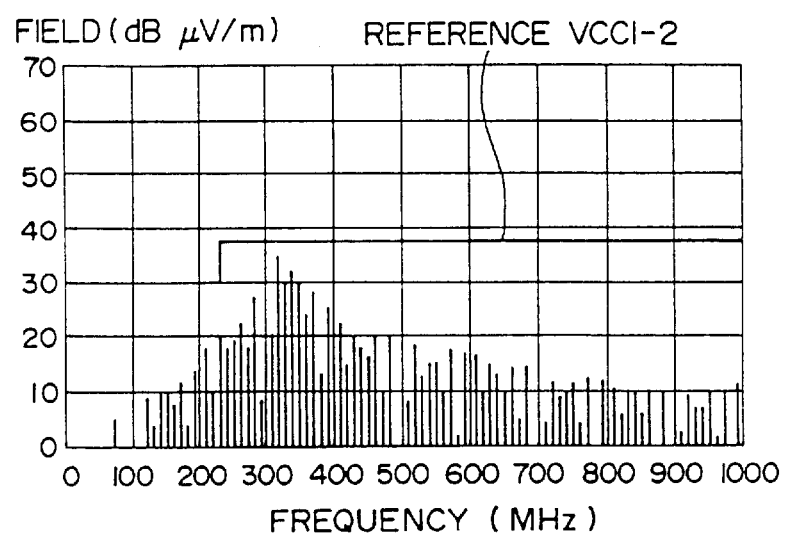

FIG. 17A shows another configuration of a circuit and a printed board. This configuration differs from that of FIG. 16A only in that the length of the signal line is half as long (75 mm). FIG. 17B shows the magnitude of the EMI radiation generated by the configuration of FIG. 17A. Shortening the length of the signal line is expected to reduce the magnitude of the EMI radiation, which can be confirmed in FIG. 17B.

Figure 18A:
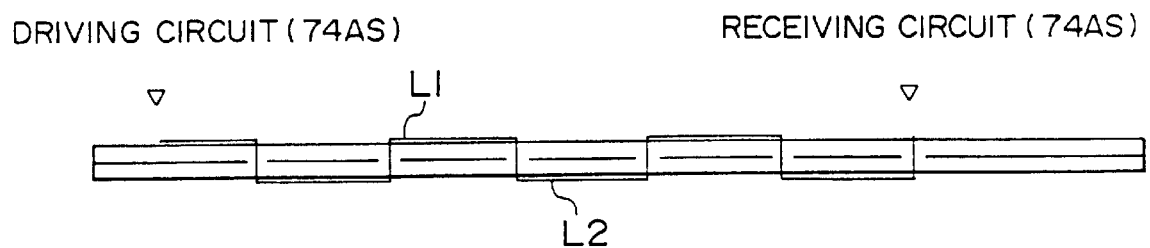
FIGS. 18A and 18B are, respectively, an illustrative drawing showing an arrangement for an electromagnetic-field simulation, and a graph showing a magnitude of EMI radiation.
Figure 18B:
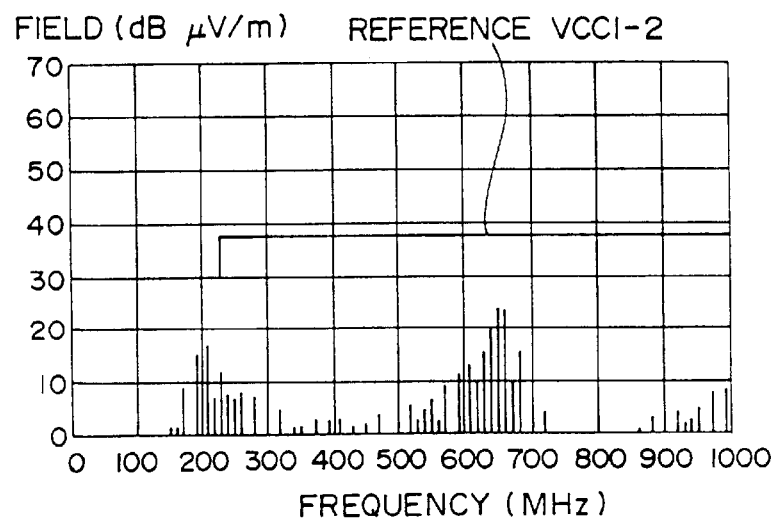

FIG. 18A shows a configuration of a circuit and a printed board according to the present invention. This configuration differs from that of FIG. 16A only in that the signal line is equally divided into six intervals. Line segments corresponding to these intervals are provided on the front side and the back side alternately, and are connected between the two sides through vias as in the fifth embodiment. FIG. 18B shows the magnitude of the EMI radiation generated by the configuration of FIG. 18A.

Figure 19A:
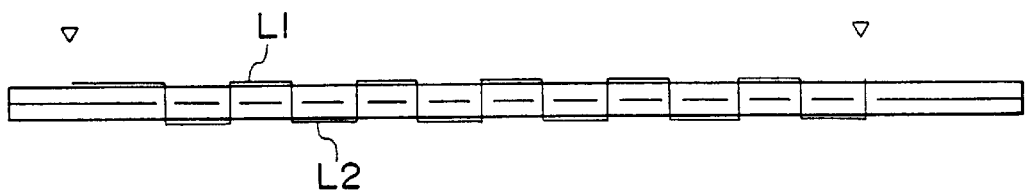
FIGS. 19A and 19B are, respectively, an illustrative drawing showing an arrangement for an electromagnetic-field simulation, and a graph showing a magnitude of EMI radiation.
Figure 19B:
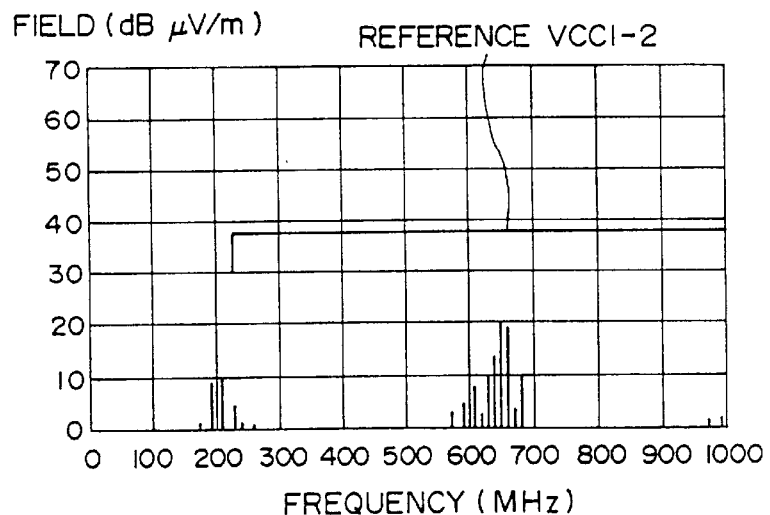

FIG. 19A shows another configuration of a circuit and a printed board according to the present invention. This configuration differs from that of FIG. 18A only in that the signal line is equally divided into twelve intervals, instead of six. FIG. 19B shows the magnitude of the EMI radiation generated by the configuration of FIG. 19A.

As shown in FIG. 16B, FIG. 17B, FIG. 18B, and FIG. 19B, the magnitude of the EMI radiation in the present invention is significantly reduced compared to that in the prior art. In FIG. 17B, there is a noticeable reduction in the magnitude of the EMI radiation because the signal lines are shortened to half as long. Nonetheless, the present invention shows a greater effect than does the shortening of the signal lines in the reduction of the EMI radiation.

As is apparent from the above description, the following advantages can be obtained according to the present invention.

According to the present invention, the signal line L is divided into the n intervals ($n \geq 1$), each of which is further divided into two halves. Thus, the electromagnetic fields generated by an electric current on the signal line L are canceled by each other between a pair of the two halves. This does not obstruct a scope for the design of the wiring pattern, yet can suppress the EMI radiation on its own.

Also, according to the present invention, the intervals into which the signal line is divided can be made small relative to a wavelength of a signal frequency on the signal line. Thus, the EMI radiation can be suppressed even more effectively.

Furthermore, according to the present invention, the forward line and the backward line are alternately formed on both sides of the two-layer printed wiring board with vias providing connections between the two sides, such that the magnetic fields generated by the electric current on the forward line and the backward line are canceled by each other. Thus, the EMI radiation can be suppressed by the wiring pattern itself on the two-layer printed wiring board, without a loss of a scope for the design of the wiring pattern.

Also, according to the present invention, the signal line is divided into segments alternately arranged on one signal layer and on the other signal layer of the three-layer printed wiring board, with the vias providing connections between the two signal layers. The electric current on the signal line and the electric current on the ground layer generate the magnetic fields, but these magnetic fields are canceled by each other. Thus, the EMI radiation can be suppressed by the wiring pattern itself on the three-layer printed wiring board, without a loss of a scope for the design of the wiring pattern.

Furthermore, according to the present invention, the signal line is divided into segments, which are fitted into elongated holes alternately formed through one ground layer and through the other ground layer of the two-layer printed wiring board having the two ground/signal layers. In this configuration, an electric current flowing in these segments connected through vias and electric current on the ground layers generate the magnetic fields which are canceled by each other. Thus, the EMI radiation can be suppressed by the wiring pattern itself on the two-layer printed wiring board having the two or more ground/signal layers, without a loss of a scope for the design of the wiring pattern.

Also, according to the present invention, when the wiring pattern is comprised of a plurality of lines connected at an angle, each of the plurality of lines are equally divided into an even number of segments. Thus, even when the wiring pattern has such a formation, the EMI radiation can be effectively suppressed.

Furthermore, according to the present invention, when the wiring pattern is comprised of a plurality of parallel signal lines with signals thereof changing in synchronism with each other, these signal lines are arranged in parallel such that an electromagnetic field generated by one line is canceled by that generated by an adjacent line. Thus, the EMI radiation can be suppressed effectively in the wiring pattern comprised of a plurality of parallel signal lines such as a bus.

Further, the present invention is not limited to these embodiments, but various variations and modifications may be made without departing from the scope of the present invention.

What is claimed is:

1. A printed wiring board comprising:

three layers including a first insulating layer, a second insulating layer, and a ground layer provided between one side of said first insulating layer and one side of said second insulating layer, said ground layer serving as a ground; and a signal line divided into segments, every other one of said segments arranged on another side of said first insulating layer and generating first electromagnetic fields, remaining ones of said segments arranged on another side of said second insulating layer and generating second electromagnetic fields, said segments arranged on said first insulating layer and said segments arranged on said second insulating layer being connected through vias formed through said ground layer, wherein said first electromagnetic fields and said second electromagnetic fields are canceled by each other.

2. A printed wiring board comprising:

at least three layers including a first ground layer provided on one side of an insulating layer and a second ground layer provided on another side of said insulating layer, said first ground layer and said second ground layer serving as a ground, and a signal line divided into segments, every other one of said segments arranged on said first ground layer and generating first electromagnetic fields, remaining ones of said segments arranged on said second around layer and generating second electromagnetic fields, said segments being placed in elongated holes formed through said first ground layer and said second ground layer and being connected through vias, wherein said first electromagnetic fields and said second electromagnetic fields are canceled by each other.

3. A printed wiring board comprising:

at least three layers including a first insulating layer, a second insulating layer, a ground layer provided between one side of said first insulating layer and one side of said second insulating layer, said ground layer serving as a ground; and a plurality of signal lines on which signals change in synchronism with each other, wherein some of said signal lines are provided on said first insulating layer and others of said signal lines are provided on said second insulating layer so that electromagnetic fields generated by said signals are canceled by each other.

* * * * *